United States Patent
Tamazaki et al.

(10) Patent No.: US 6,911,881 B2
(45) Date of Patent: Jun. 28, 2005

(54) SURFACE ACOUSTIC WAVE DEVICE

(75) Inventors: Daisuke Tamazaki, Nagaokakyo (JP);
Takeshi Nakao, Nagaokakyo (JP);
Toshimaro Yoneda, Ishikawa-ken (JP)

(73) Assignee: Murata Manufacturing Co., LTD, Kyoto (JP)

(*) Notice: Subject to any disclaimer, the term of this patent is extended or adjusted under 35 U.S.C. 154(b) by 86 days.

(21) Appl. No.: 10/460,299

(22) Filed: Jun. 13, 2003

(65) Prior Publication Data

US 2004/0021530 A1 Feb. 5, 2004

(30) Foreign Application Priority Data

Jun. 13, 2002 (JP) .......................................... 2002-173215
May 19, 2003 (JP) .......................................... 2003-140535

(51) Int. Cl.⁷ ................................................. H03H 9/00
(52) U.S. Cl. .................... 333/195; 333/193; 310/313 D
(58) Field of Search ................................. 333/193, 194, 333/195; 310/313 B, 313 C, 313 D, 313 R

(56) References Cited

U.S. PATENT DOCUMENTS

| | | | | |
|---|---|---|---|---|
| 4,468,642 A | * | 8/1984 | Hikita | ......................... 333/193 |
| 5,202,652 A | * | 4/1993 | Tabuchi et al. | ............. 333/193 |
| 6,121,860 A | * | 9/2000 | Tsutsumi et al. | ........... 333/195 |

FOREIGN PATENT DOCUMENTS

| | | |
|---|---|---|
| JP | 63-12930 | 1/1988 |
| JP | 02-075217 | 3/1990 |
| JP | 05-102783 | 4/1993 |
| JP | 07-066678 | 3/1995 |
| JP | 10-190404 | 7/1998 |

* cited by examiner

Primary Examiner—Daniel Chang
(74) Attorney, Agent, or Firm—Keating & Bennett, LLP

(57) ABSTRACT

A surface acoustic wave device has first and second surface acoustic wave filter elements which are arranged on a surface acoustic wave substrate so as to define a filter device having a two-stage configuration. A free surface portion is provided by forming a perforation in an inter-stage connecting portion connecting the first and second surface acoustic wave filter elements.

23 Claims, 9 Drawing Sheets

SURFACE ACOUSTIC WAVE DEVICE

BACKGROUND OF THE INVENTION

1. Field of the Invention

The present invention relates to a surface acoustic wave device for use as a resonator, a band filter, or other suitable device, and more particularly, the present invention relates to a surface acoustic wave device which has a configuration including at least two stages.

2. Description of the Related Art

According to the related art, there have been proposed various surface acoustic wave devices in which at least two surface acoustic wave filter elements are cascaded so that the attenuation is increased. FIG. 9 is a plan view of an example of such a surface acoustic wave device.

The surface acoustic wave device 101 contains a piezoelectric substrate 102. A longitudinally coupled type first surface acoustic wave filter element 103 and a longitudinally coupled type second surface acoustic wave filter element 104 are disposed on the piezoelectric substrate 102. The surface acoustic wave filter elements 103 and 104 are electrically connected to each other via an inter-stage connecting portion 105. The interdigital transducers and the reflectors which constitute the surface acoustic wave filter elements 103 and 104 and the inter-stage connecting portion 105 are made of a metallic material such as Al.

Referring to surface acoustic wave devices in which at least two surface acoustic wave elements are connected to form a configuration with at least two stages such as the surface acoustic wave device 101, problems have occurred in that a surface acoustic wave excited in an surface acoustic wave element is leaked and transmitted to another surface acoustic wave element, which deteriorates the characteristics of the device. For example, the attenuation in the frequency region which is out of the band (hereinafter, referred to as an out-of-band region), is decreased. Thus, in some cases, the desired effects of the configuration including at least two stages can not be obtained.

According to Japanese Examined Utility Model Registration Application Publication No. 63-12930 (Patent Literature 1), to solve the above-described problems, a surface acoustic wave device having a sound-absorbing material arranged between multi-mode surface acoustic wave filters is disclosed. Moreover, according to Japanese Unexamined Patent Application Publication No. 10-190404 (Patent Literature 2), a surface acoustic wave device provided with a resin pattern having a high absorptivity for a surface acoustic wave, the resin pattern being located between transversely-coupled type multi-mode surface acoustic wave filters having an at least two-stage configuration is disclosed. Furthermore, according to Japanese Unexamined Patent Application Publication No. 7-66678 (Patent Literature 3), a surface acoustic wave device in which a sound-absorbing material is coated between adjacent surface acoustic wave filter elements is disclosed.

Moreover, according to Japanese Unexamined Patent Application Publication No. 5-102783 (Patent Literature 4), a surface acoustic wave device having at least two surface acoustic wave elements which are cascaded is disclosed. In this device, a groove is formed on the surface of a piezoelectric substrate of the device, so that a surface acoustic wave can be reflected from and scattered over the groove.

According to the above-described configurations in which the sound-absorbing material, the resin pattern, or the like is provided between surface acoustic wave elements, an area for locating the sound-absorbing material and so forth is required. Thus, increases in the size of such a surface acoustic wave device can not be avoided. Moreover, additional materials such as the sound-absorbing material or the like are required, and also, a process of coating the sound-absorbing material or the like must be carried out. Thus, there have been problems in that the production efficiency becomes low, and the cost is increased.

Furthermore, according to the configuration in which a groove is formed between adjacent surface acoustic wave elements on a piezoelectric substrate as disclosed in Patent Literature 4, increasing the size of the device can not be avoided, since the groove is formed. In addition, the piezoelectric substrate may be cracked or cut during formation of the groove. Furthermore, a process of forming the groove needs to be carried out. Thus, there have been problems in that the production process for the device is complicated, and the non-defective ratio is reduced.

SUMMARY OF THE INVENTION

In order to solve the problems described above, preferred embodiments of the present invention provide a surface acoustic wave device in which deterioration of the characteristics, which will be caused by the influences of a surface acoustic wave propagated from a surface acoustic wave element to another surface acoustic wave element, is reliably prevented, while the size of the device is not increased, the production process does not become complicated, and the non-defective ratio is not reduced.

According to a preferred embodiment of the present invention, a surface acoustic wave device includes a surface acoustic wave substrate, at least two surface acoustic wave elements disposed on the surface acoustic wave substrate, at least one inter-stage connecting portion electrically connecting the at least two surface acoustic wave elements to each other, whereby the device has an at least two-stage configuration including the at least two surface acoustic wave elements, and a free surface portion located inside the at least one inter-stage connecting portion. Vibration propagated from the surface acoustic wave element is reflected from and scattered over the boundary between the free surface portion and the electrode film constituting the inter-stage connecting portion. Accordingly, the deterioration of the characteristics of the device such as the deterioration of the attenuation in the out-of-band region, which are caused by a surface acoustic wave being propagated from the surface acoustic wave element to the adjacent surface acoustic wave element, is reliably prevented.

The free surface portion may have different shapes. Preferably, the free surface portion is a surface region inside of a perforation, or through-hole, formed in the inter-stage connecting portion. The perforation is not limited to a particular shape or size. Preferably, the perforation is a slit having an elongated shape.

When the slit having an elongated shape is used to form the free surface portion, the direction of the slit is not particularly limited. Preferably, the slit is arranged substantially parallel to the direction in which a surface acoustic wave is propagated on the surface acoustic wave elements connected to the inter-stage connecting portion having the slit formed therein, or is arranged so as to intersect the propagation direction of the surface acoustic wave. Moreover, the slit may be arranged in a direction that is substantially perpendicular to the propagation direction of the surface acoustic wave.

Moreover, at least two slits may be provided.

According to another preferred embodiment of the present invention, a surface acoustic wave device includes a surface acoustic wave substrate, at least two surface acoustic wave elements disposed on the surface acoustic wave substrate, at least one inter-stage connecting portion electrically connecting the at least two surface acoustic wave elements to each other, whereby the device has an at least two-stage configuration including the at least two surface acoustic wave elements, and at least one cut portion formed in the inter-stage connecting portion, the cut portion having at least one protuberance located on at least one side of the cut portion, the cut portion defining the free surface portion.

Preferably, the inter-stage connecting portion is made of a metal that is heavier than Al. In this case, the sound velocity becomes very small in the metallized region of the inter-stage connecting portion. Thus, the difference between the sound velocities in the metallized portion and a free surface area becomes large. Therefore, the deterioration of the characteristics of the device which is caused by a surface acoustic wave leaked in concentration into the metallized portion, becomes a large problem. However, even though the inter-stage connecting portion is made of a metal that is heavier than Al, a leaked surface acoustic wave is reflected from and scattered over the boundary of the free surface portion and the metallized portion. Accordingly, the deterioration of the characteristics can be effectively suppressed. Thus, the present invention can be suitably applied to a surface acoustic wave device of which the inter-stage connecting portion is made of a metal that is heavier than Al.

The metal that is heavier than Al is not limited to any particular one. For example, as the metal, at least one metal selected from the group consisting of Ta, W, Au, Pt, Ag, Mo, Cu, Ni, Co, Cr, Fe, Mn, and Ti, or an alloy containing the metal as a major component, can be used.

The surface acoustic wave substrate may be made of a piezoelectric single crystal substrate.

As the surface acoustic wave elements, surface acoustic wave resonators or surface acoustic wave filter elements may be used.

Referring to production of the prior art surface acoustic wave device provided with a groove or a sound-absorbing material, a complicated process of grooving or providing the sound-absorbing material need to be carried out. According to preferred embodiments of the present invention, the free surface portion can be formed easily and simultaneously with the formation of the inter-stage connecting portion. Accordingly, the deterioration of the characteristics, which will be caused by the propagation of a surface acoustic wave, can be reliably prevented without the production process becoming complicated, and the cost increasing.

Referring to the related art surface acoustic wave device having a groove formed between adjacent surface acoustic wave elements, the piezoelectric substrate is cracked or cut in some cases. According to preferred embodiments of the present invention, such a grooving process is not required. Thus, cracking or cutting of the surface acoustic wave substrate can be eliminated.

Moreover, grooving and providing a sound-absorbing material are not required. Thus, the size of the surface acoustic wave device is not increased.

Thus, according to preferred embodiments of the present invention, a surface acoustic wave device having sufficient filter-characteristics and resonance-characteristics can be provided while a complicated production process and increasing of the size of the surface acoustic wave device are eliminated.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

The present invention will be more apparent from the following description of the specific preferred embodiments of the present invention.

Figure 1:
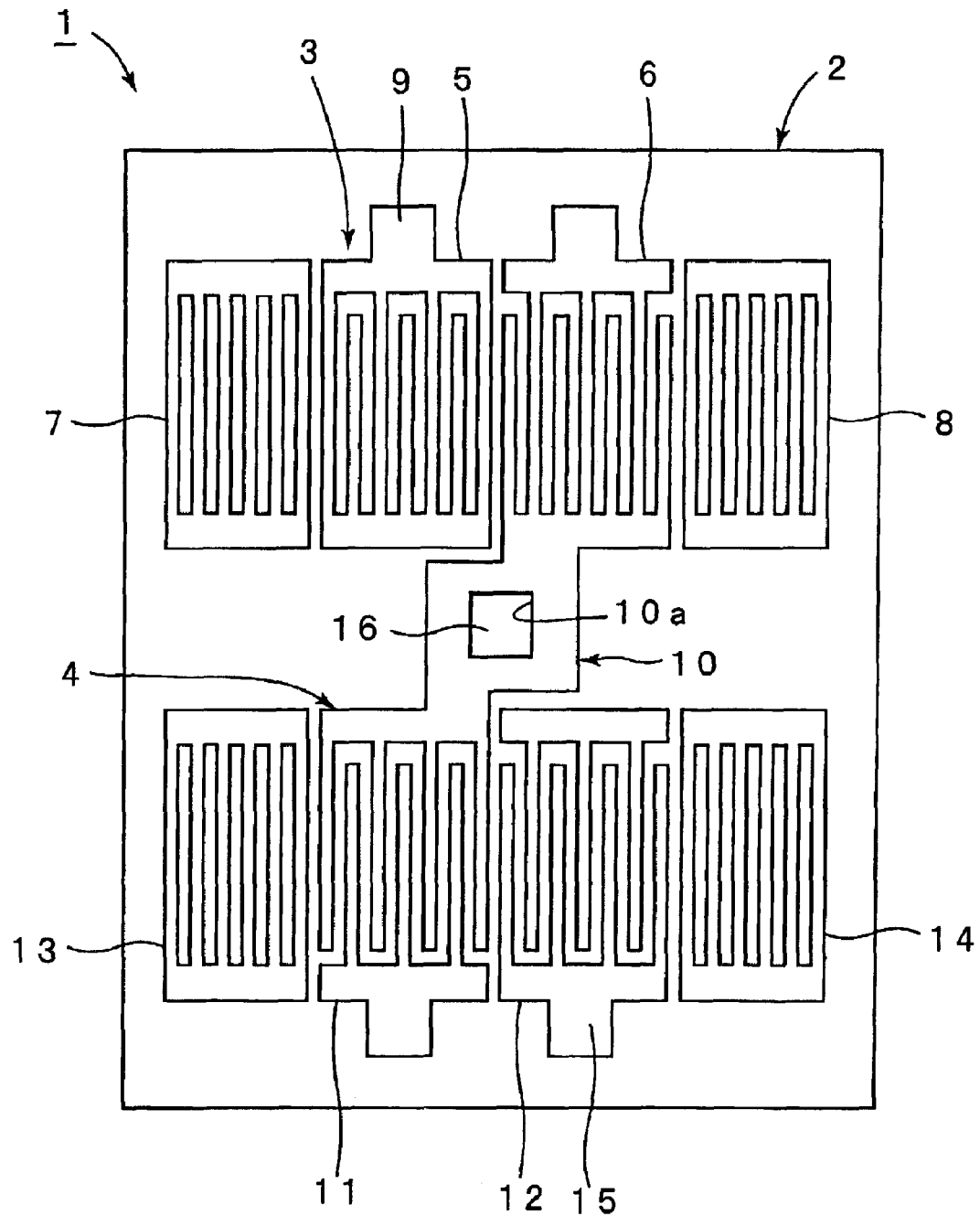
FIG. 1 is a plan view of a surface acoustic wave device according to a first preferred embodiment of the present invention.

FIG. 1 is a plan view of a surface acoustic wave device according to a first preferred embodiment of the present invention.

A surface acoustic wave device 1 preferably includes a substantially rectangular sheet-shaped surface acoustic wave substrate 2. In the first preferred embodiment, the surface acoustic wave substrate 2 is preferably made of a Y-cut 90° X-direction propagation crystal substrate. The surface acoustic wave substrate 2 may be formed of another piezoelectric single crystal or may be made of a piezoelectric ceramic.

Moreover, the surface acoustic wave substrate 2 may be produced by formation of a piezoelectric thin film on an insulating substrate or by formation of a piezoelectric thin film on a piezoelectric substrate.

Longitudinally coupled type first and second surface acoustic wave filter elements 3 and 4 are formed on the surface acoustic wave substrate 2. The first surface acoustic wave filter element 3 preferably includes IDTs (interdigital transducer) 5 and 6, and reflectors 7 and 8.

One of the comb-like electrodes of the IDT 5 is electrically connected to an input terminal 9. One of the comb-like electrodes of the IDT 6 is electrically connected to an inter-stage connecting portion 10.

The second surface acoustic wave filter element 4 includes IDTs 11 and 12, and reflectors 13 and 14. One of the comb-like electrodes of the IDT 11 is electrically connected to the inter-stage connecting portion 10. One of the comb-like electrodes of the IDT 12 is electrically connected to an output terminal 15. The others of the comb-like electrodes of the IDTs 5, 6, 11, and 12, not mentioned above, are connected to have a ground potential. Differential inputting may be carried out between the terminal and the ground of each IDT.

In the surface acoustic wave device 1, the first and second surface acoustic wave filter elements 3 and 4 are connected to each other via the inter-stage connecting portion 10. Thus, a surface acoustic wave filter device having a two-stage configuration is provided.

The IDTs 5, 6, 11, and 12, the reflectors 7, 8, 13, and 14, and the inter-stage connecting portion 10 are formed preferably by applying a Ta film to the entire surface of the surface acoustic wave substrate 2, and patterning the film.

One of the unique features of this preferred embodiment is that a substantially rectangular perforation, or through-hole, 10a is formed in the inter-stage connecting portion 10, so that the inner portion of the peroration 10a constitutes a free surface portion 16. Further, the perforation penetrates through the inter-stage connecting portion 10. Thus, the free surface portion 16 indicates a portion where a surface of the surface acoustic wave substrate 2 is exposed, and the electrode or metallized portion of the inter-stage connecting portion 10 is not disposed.

When the surface acoustic wave device 1 is driven, an input signal is supplied via the input terminal 9, and an output from the first surface acoustic wave filter element 3 is fed to the second surface acoustic wave filter element 4 via the inter-stage connecting portion 10 and is output from the output terminal 15 connected to the IDT 12 of the second surface acoustic wave filter element 4. Since the first and second surface acoustic wave filter elements 3 and 4 are cascaded as described above, the attenuation in the out-of-band region can be increased compared to that of a surface acoustic wave device having a one-stage surface acoustic wave filter element.

As described above, problematically, a surface acoustic wave excited in the first surface acoustic wave filter 3 is mechanically propagated to the second surface acoustic wave filter element 4 side, so that the attenuation in the out-of-band region is reduced. However, according to this preferred embodiment, the inter-stage connecting portion 10 has the free surface portion 16. Thus, a surface acoustic wave propagated to the inter-stage connecting portion 10 is reflected from and scattered over the boundary between the free surface portion 16 and the metallized layer, i.e., is reflected from and scattered over the periphery of the perforation 10a. Therefore, further propagation of the surface acoustic wave from the surface acoustic wave filter element 3 to the surface acoustic wave filter element 4 via the inter-stage connecting portion 10 is effectively prevented. Thus, the deterioration of the characteristics of the device, which will be caused by a surface acoustic wave propagated via the inter-stage connecting portion 10, can be prevented.

In the above-described preferred embodiment, the surface acoustic wave substrate 2 is preferably made of a Y-cut–90° X-propagation crystal substrate. In the case of the Y-cut–90° X-propagation crystal substrate, if no electrode is provided on the surface of the substrate, a large portion of the surface acoustic wave will be leaked, since the surface acoustic wave is converted to the backward-wave inside of the substrate. Thus, the substrate itself has such a property that a surface acoustic wave is propagated thereon with much difficulty. It is speculated that when the free surface portion 16 is provided in the inter-stage connecting portion 10, a portion of a surface acoustic wave propagated thereto is absorbed in the free surface portion 16. That is, according to this preferred embodiment, the free surface portion 16 is provided, so that the propagation of a surface acoustic wave to the surface acoustic wave filter element 4 side is suppressed by the reflection and scattering, and in addition, the propagation of the surface acoustic wave can be suppressed and prevented by the above-described absorbing action. The same operation and advantages can be obtained when an $LiNbO_3$ substrate, an $LiTaO_3$ substrate, or other suitable substrate is used.

Moreover, according to this preferred embodiment, the inter-stage connecting portion 10 is preferably made of Ta which is a metal that is heavier than Al. In this case, the sound velocity in the metallized layer is much smaller than that in the free surface portion 16. Thus, the deterioration of the characteristics of the device, caused by a surface acoustic wave propagated via the inter-stage connecting portion 10, becomes a large problem. However, according to this preferred embodiment, the free surface portion 16 is provided, and therefore, the deterioration of the characteristics is effectively prevented.

In particular, according to preferred embodiments of the present invention, the free surface portion 10 is formed in the inter-stage connecting portion 10 considering that a surface acoustic wave propagated via the inter-stage connecting portion 10 exerts a large influence over the characteristics of the device. According to the related art, a groove and a sound-absorbing material is arranged in the entire area between adjacent surface acoustic wave elements. On the other hand, according to this preferred embodiment of the present invention, the free surface portion 16 is formed and located in the inter-stage connecting portion 10 only. That is, a process of grooving or providing a sound-absorbing material in the entire space between the surface acoustic wave filter elements 3 and 4 is not required. According to this preferred embodiment, it is sufficient to form the free surface portion 16 so that only the inter-stage connecting portion 10 includes the free surface portion 16.

Figure 2:
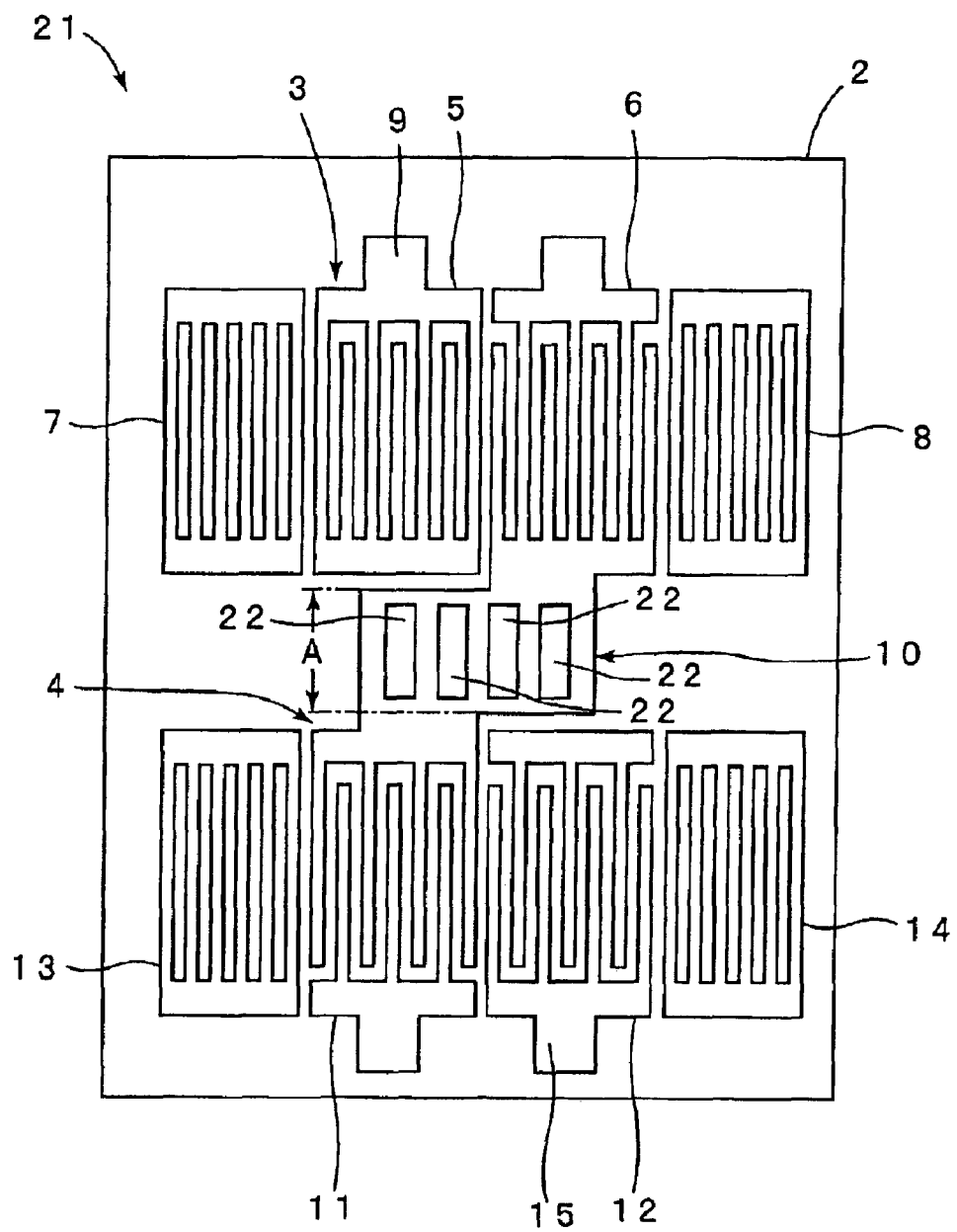
FIG. 2 is a plan view of a surface acoustic wave device according to a second preferred embodiment of the present invention.

FIG. 2 is a plan view of a surface acoustic wave device according to a second preferred embodiment of the present invention. The surface acoustic wave device 21 of the second preferred embodiment preferably has the same configuration as that of the first embodiment except that the shape and size of the free surface portion located in the inter-stage connecting portion 10 is different from that of the first preferred embodiment. Regarding the configuration of the surface acoustic wave device 21 which excludes the free surface portion, the description is omitted, since the same description as that of the first preferred embodiment can be applied. Repetition of the description is omitted.

In the surface acoustic wave device 21 of the second preferred embodiment, at least two slits 22 each having an elongated shape are provided in the form of perforations. The inner surfaces of the slits 22 constitute the free surface portions, respectively. According to this preferred embodiment, the length direction of each slit 22 is substantially perpendicular to the direction of a surface acoustic wave propagated in the first and second surface acoustic wave filter elements 3 and 4.

Figure 3:
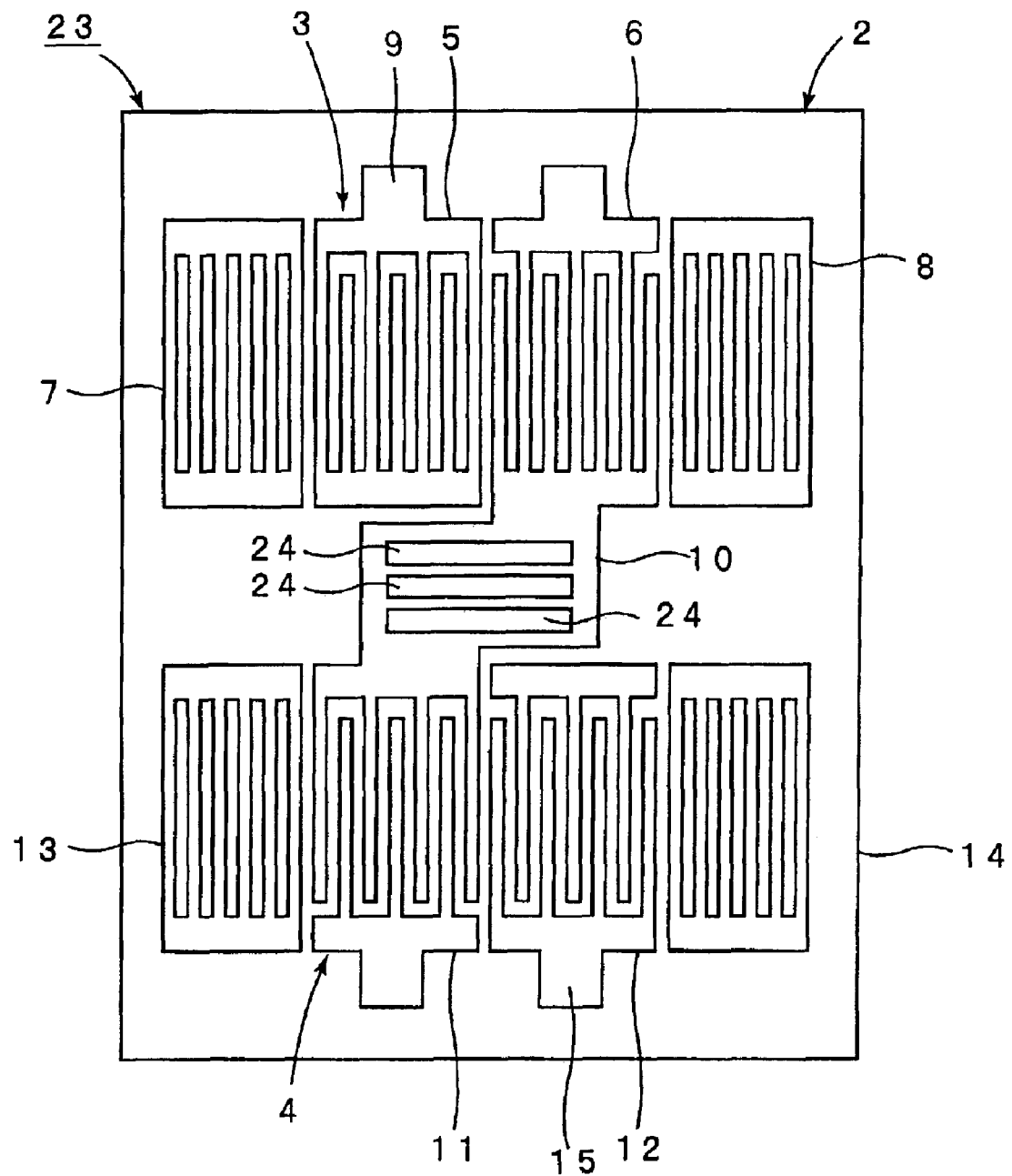
FIG. 3 is a plan view of a modification of the surface acoustic wave device of the second preferred embodiment of the present invention.

As described above, according to preferred embodiments of the present invention, as the perforation constituting the free surface portion, the slits 22 having an elongated shape, i.e., having a length direction may be formed. FIG. 3 is a plan view of a surface acoustic wave device according to a modification of the second preferred embodiment. In the surface acoustic wave device 21 of FIG. 2, at least two slits 22 are formed so as to be extended substantially perpendicularly to the direction of a surface acoustic wave propagated in the surface acoustic wave filter elements 3 and 4. At least two slits 24 may be formed so as to be extended substantially parallel to the propagation direction of a surface acoustic wave in the surface acoustic wave filter elements 3 and 4, as seen in the surface acoustic wave device of FIG. 3.

Figure 4:
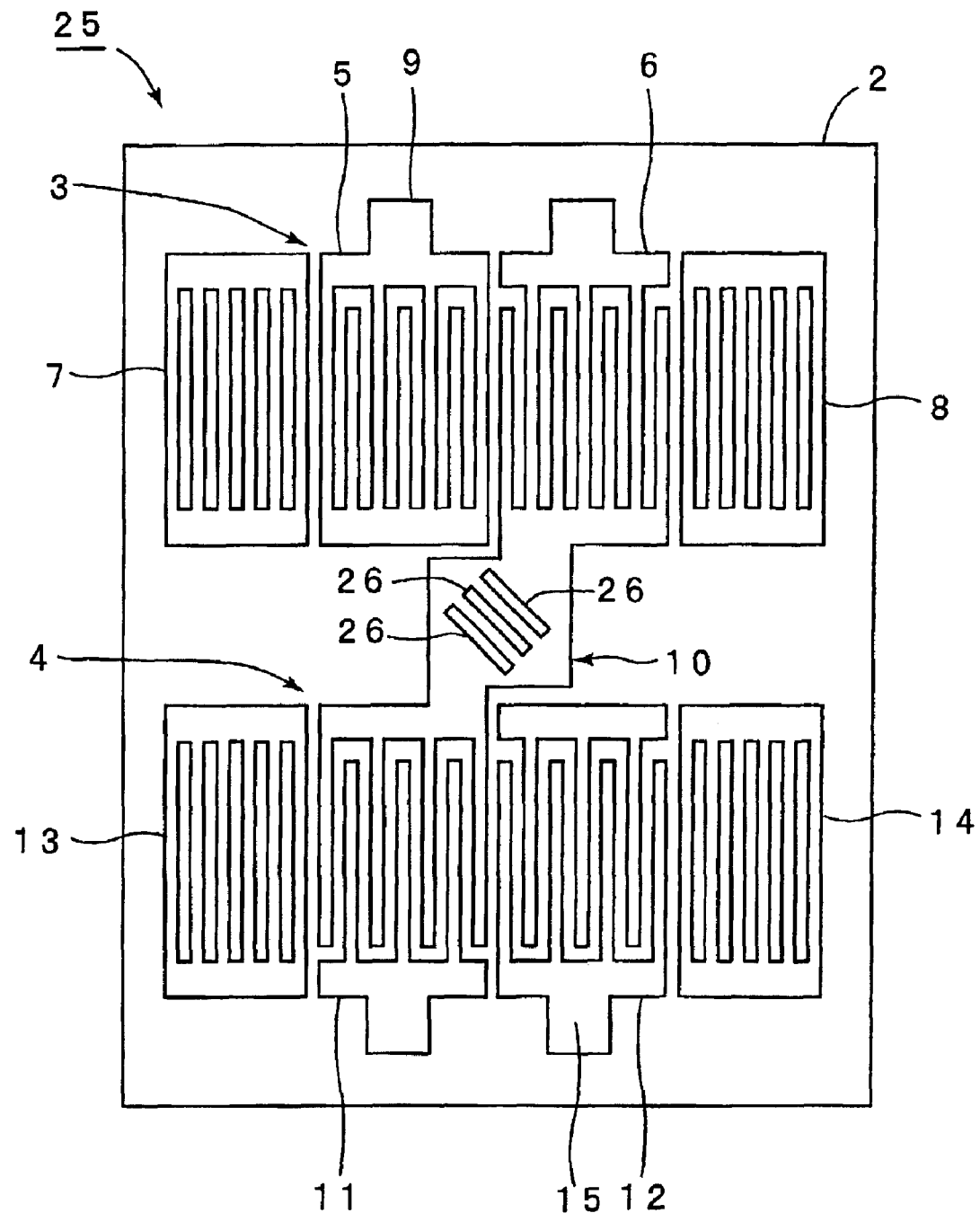
FIG. 4 is a plan view of another modification of the surface acoustic wave device of the second preferred embodiment of the present invention.

FIG. 4 is a plan view of another modification of the second preferred embodiment. In a surface acoustic wave device 25 of FIG. 4, at least two slits 26 are arranged neither in parallel to nor perpendicular to the propagation direction of a surface acoustic wave in the surface acoustic wave elements 3 and 4. That is, the at least two slits 26 are arranged in the direction at an angle of θ (0>θ>90°) relative to the propagation direction of a surface acoustic wave in the elements 3 and 4. Thus, according to certain preferred embodiments of the present invention, a slit constituting the perforation may be provided so as to obliquely intersect the propagation direction of a surface acoustic wave in the surface acoustic wave filter elements 3 and 4.

It should be noted that the term of "the intersecting direction" in the expression of "the slit is extended so as to intersect the propagation direction of a surface acoustic wave" includes the direction in which the slit obliquely intersects the propagation direction of a surface acoustic wave and also the direction which is substantially perpendicular to the propagation direction of a surface acoustic wave as shown in FIG. 3.

Figure 5:
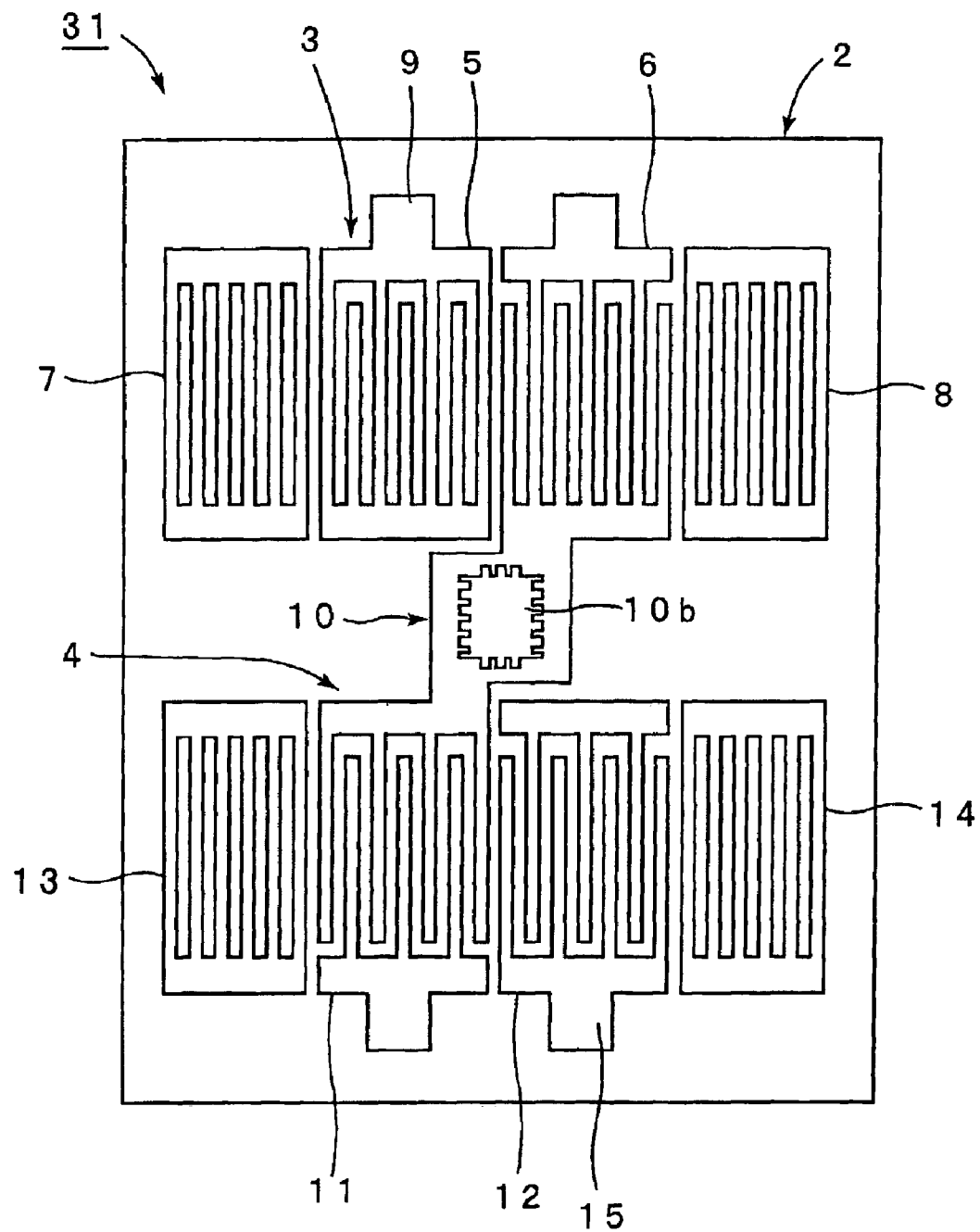
FIG. 5 is a plan view of a modification of the surface acoustic wave device of the first preferred embodiment of the present invention.

FIG. 5 is a plan view of a surface acoustic wave device according to a modification of the first preferred embodiment. In the surface acoustic wave device 1 of the first preferred embodiment, the substantially rectangular perforation 10a is formed in the inter-stage connecting portion 10 to constitute the free surface portion 16. As shown in FIG. 5, a perforation 10b having a convex and concave shape in the peripheral portion thereof may be formed to constitute the free surface portion 16.

In particular, the peripheral portion of the perforation formed in the inter-stage connecting portion 10 does not necessarily have a linear shape. The peripheral portion may have lots of convexities and concavities, or may be formed to have a curved shape, or may have a wavy shape.

Figure 6:
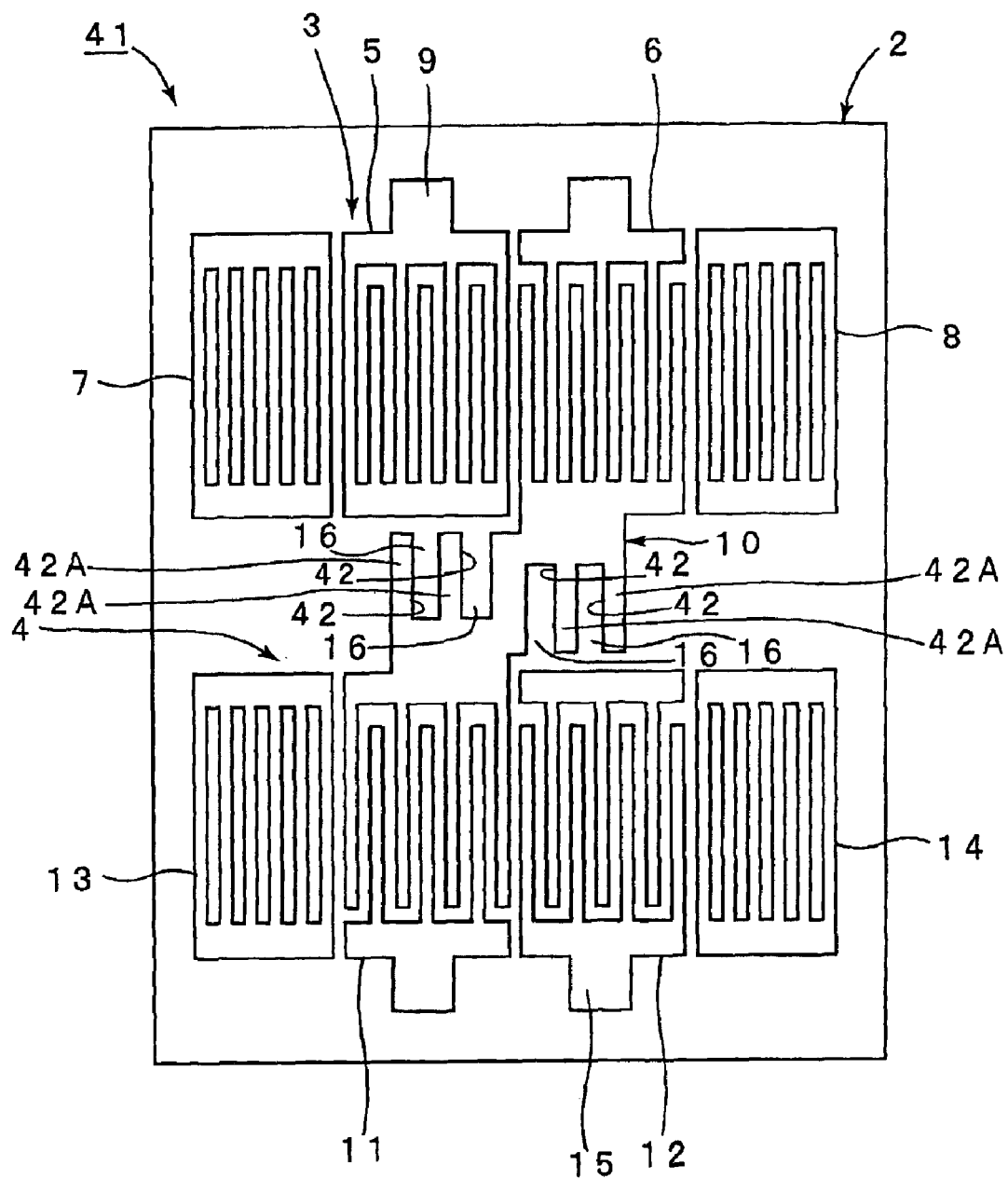
FIG. 6 is a plan view of a surface acoustic wave device according to a third preferred embodiment of the present invention.

FIG. 6 is a plan view of a surface acoustic wave device according to a third preferred embodiment of the present invention.

In the respective surface acoustic wave devices of the first and second preferred embodiments and the modifications thereof, the perforation is provided in the inter-stage connecting portion, and the inner surface of the perforation constitutes the free surface portion. According to a surface acoustic wave device 41 of a third preferred embodiment, at least two cut-portions 42, instead of the perforation, are formed in the inter-stage connecting portion 10. The surface area inside each cut-portion 42 constitutes the free surface portion 16. Thus, the free surface portion 16 is not restricted to the perforation formed in the inter-stage connecting portion 10. As described above, the free surface portion 16 may be formed in the inter-stage connecting portion 10 in such a manner that at least one cut-portion having a partially open periphery is formed whereby a protuberance 42A is formed on at least one side of the cut-portion. The protuberances 42A are formed due to the formation of the cut-portions 42. Thus, the protuberances 42 are positioned within the inter-stage connecting portion.

As seen in the first to third preferred embodiments and the modifications shown in FIGS. 1 to 6, the free surface portion is not limited to a particular form. The surface acoustic wave leaked and propagated to the free surface portion is reflected from and scattered over the boundary between the free surface portion and the metallic film constituting the inter-stage connecting portion. Thus, the free surface portion can effectively suppress and prevent the propagation of a surface acoustic wave to the second surface acoustic wave filter element 4 side, as described in the first preferred embodiment.

Hereinafter, the experimental examples will be described to make more apparent the surface acoustic wave device according to preferred embodiments of the present invention.

EXPERIMENTAL EXAMPLE 1

The surface acoustic wave device 21 of the second preferred embodiment was produced as follows. For the surface acoustic wave substrate 2, a Y-90° X-direction propagation crystal substrate was prepared. A Ta film having a thickness of about 700 µm was formed on the surface of the surface acoustic wave substrate 2, and was patterned. Thus, an example of the surface acoustic wave device 21 of the second preferred embodiment was obtained. The number of pairs of electrode fingers of each of the surface acoustic wave filter elements 3 and 4 was thirteen. The electrode finger pitch was about 15 µm. The inter-stage connecting portion 10 of which the size in the longitudinal direction shown by arrow A of FIG. 2 was about 200 µm, and the size in the direction substantially perpendicular to the longitudinal direction was about 250 µm, and which contained four rectangular slits 22 each having a size of approximately 120 µm×10 µm in width was formed. For comparison, a surface acoustic wave device was formed in the same manner as that of the second preferred embodiment except that no slits 22 were provided.

Figure 7:
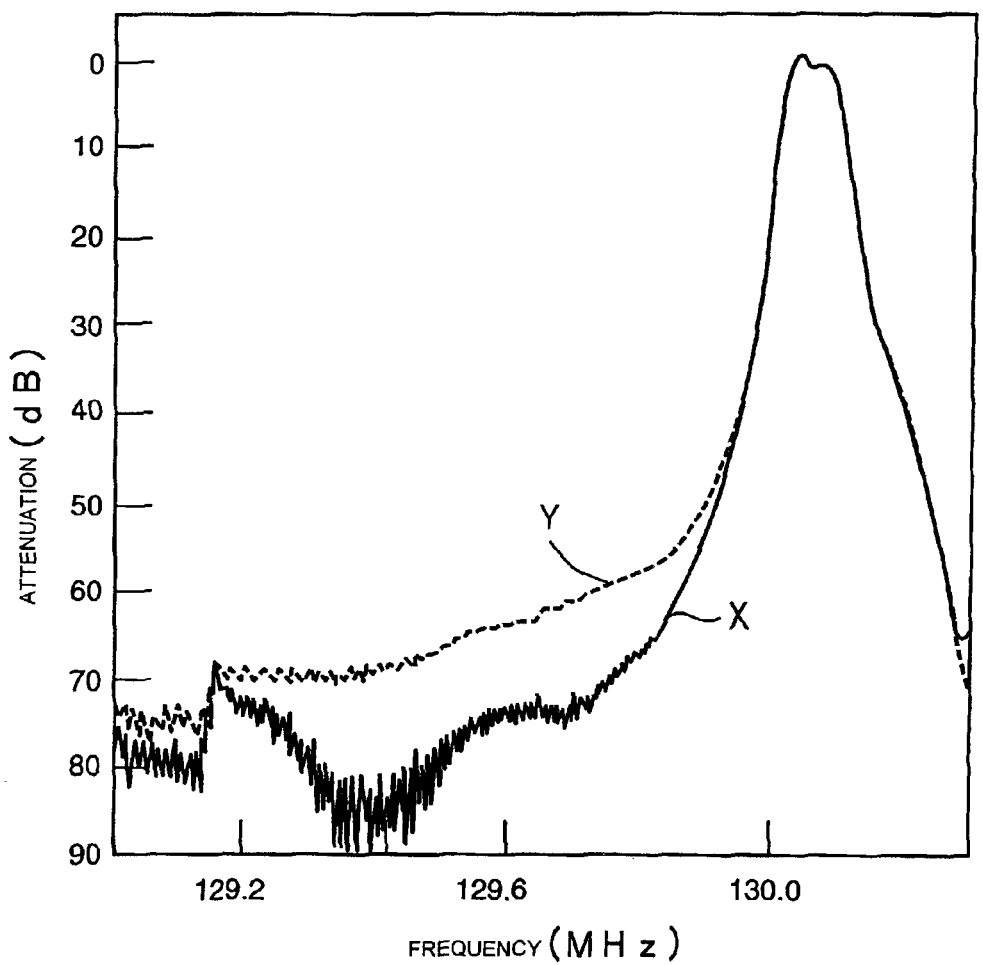
FIG. 7 is a graph showing the attenuation-frequency characteristics of the surface acoustic wave devices of the second preferred embodiment and a comparative example.

FIG. 7 shows the attenuation-frequency characteristics of the surface acoustic wave devices of the second preferred embodiment and the comparative example.

In FIG. 7, solid line X represents the experimental results of the second preferred embodiment, and broken line Y represents the experimental results of the comparative example.

As seen in FIG. 7, according to the second preferred embodiment in which the slits 22 are formed, the attenuation in the out-of-band region can be significantly improved compared to the surface acoustic wave device of the comparative example.

EXPERIMENTAL EXAMPLE 2

Figure 8:
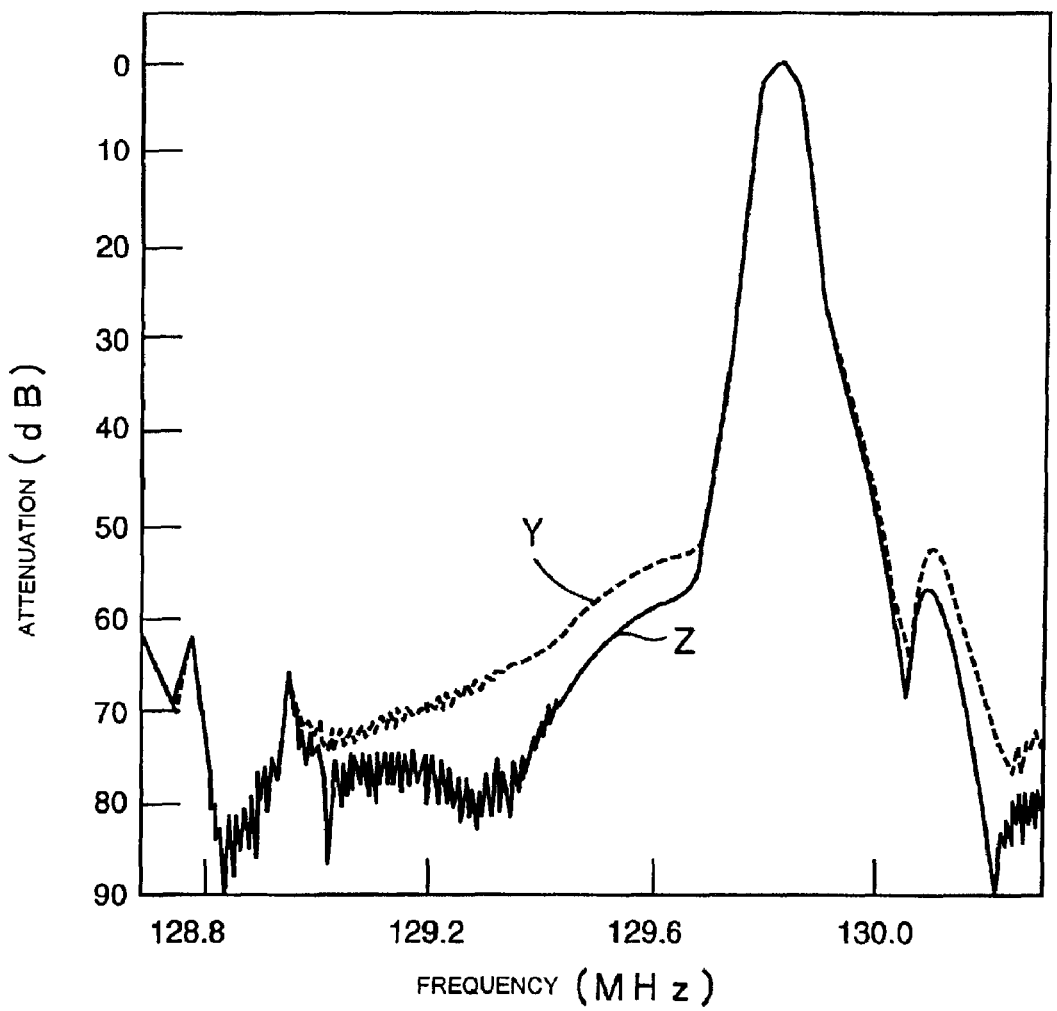
FIG. 8 is a graph showing the attenuation-frequency characteristics of the modification of the surface acoustic wave devices shown in FIG. 3 and the comparative example.
Figure 9:
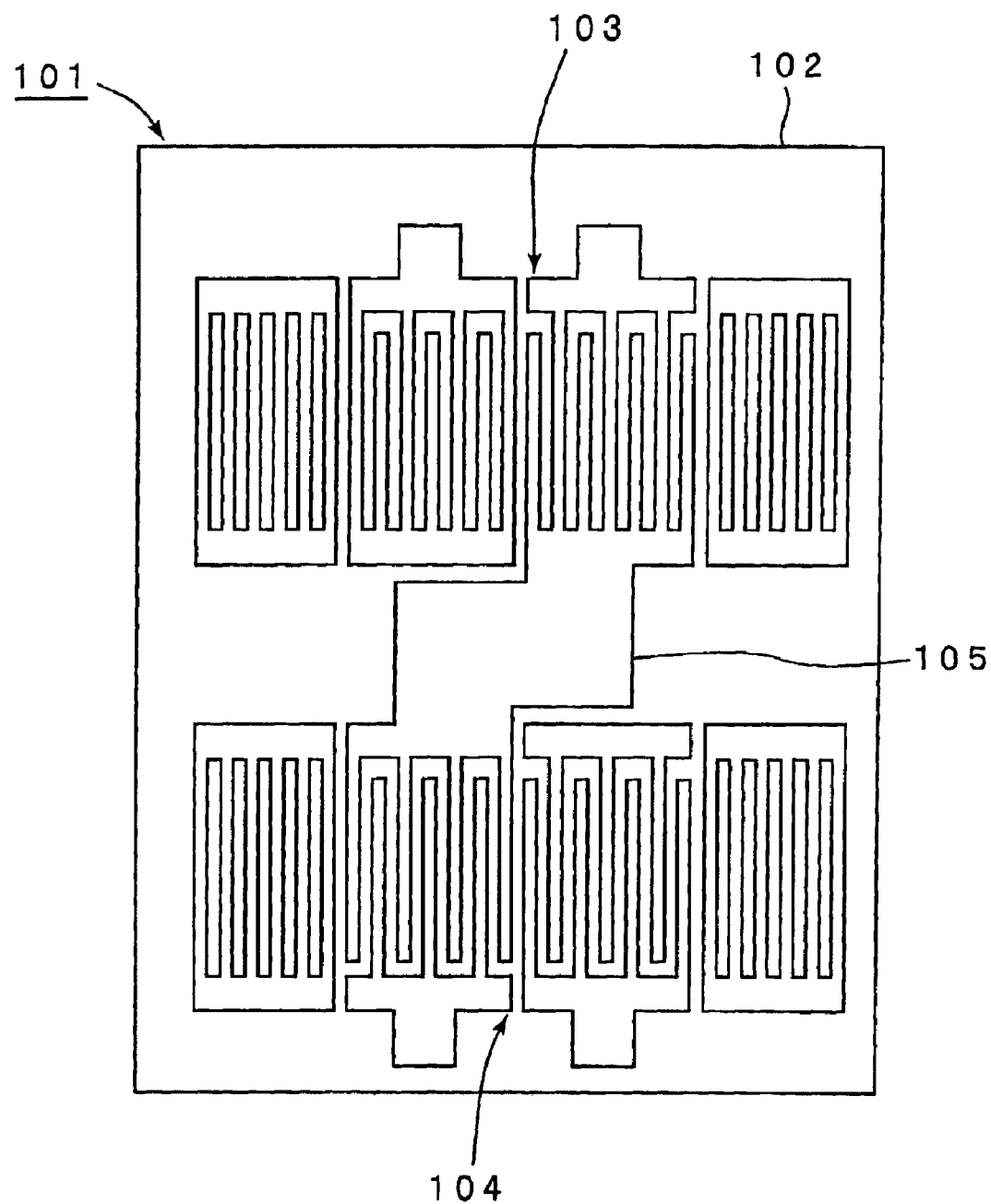
FIG. 9 is a plan view of an example of a related art surface acoustic wave device.

The surface acoustic wave device 23 of the modification shown in FIG. 3 was formed in the same manner as the surface acoustic wave device of the second example produced in Experimental Example 1. The slits 24 had a size of about 150 µm×about 10 µm. The number of the slits was three. In FIG. 8, solid line Z represents the attenuation—frequency characteristic of the surface acoustic wave device 23 of the modification shown in FIG. 3. Broken line Y in FIG. 8 represents the attenuation—frequency characteristic of the surface acoustic wave device of the comparative example prepared in Experimental Example 1.

As seen in FIG. 8, according to the surface acoustic wave device of the modification of FIG. 3, the attenuation in the out-of-band region is significantly improved compared with the surface acoustic wave device of the comparative example.

Thus, as revealed by the results of Experimental Examples 1 and 2, the deterioration of the characteristic of the device, which will be caused by the propagation of a surface acoustic wave between the adjacent surface acoustic wave filter elements, can be reliably prevented by providing the free surface portion in the inter-stage connecting portion according to various preferred embodiments of the present invention. Thus, in the surface acoustic wave device having an at least two-stage configuration, increasing of the attenuation in the out-of-band region, caused by the at least two-stage configuration, can be ensured.

In the above-described preferred embodiments and modifications, the first and second longitudinally coupled type surface acoustic wave filter elements 3 and 4 are connected to each other via the inter-stage connecting portion 10. The surface acoustic wave elements to be connected are not limited to the longitudinally coupled type surface acoustic wave filter elements. The surface acoustic wave elements may be transversely coupled type surface acoustic wave filter elements, and also may be other surface acoustic elements such as surface acoustic wave resonators or the like, not the surface acoustic wave filter elements.

Moreover, at least three surface acoustic wave elements may be connected to each other via at least two inter-stage connecting portions. In this case, at least one of the at least two inter-stage connecting portions may be provided with the free surface portion according to preferred embodiments of the present invention. Thereby, the advantages of the present invention can be also obtained. Preferably, according to preferred embodiments of the present invention, the free surface portions are provided in all the inter-stage connecting portions, respectively, to obtain larger advantages.

In the above-described preferred embodiments, the inter-stage connecting portion 10 is preferably made of Ta. The inter-stage connecting portion 10 may be made of another metal such as Al. Preferably, the inter-stage connecting portion 10 is made of a metal that is heavier than Al as described above. In this case, the advantages are high. The metal that is heavier than Al is not limited to a particular metal. For example, Ta, W, Au, Pt, Ag, Me, Cu, Ni, Co, Cr, Fe, Mn, and Ti are suitable as the metal heavier than Al.

The present invention, which is not limited to a surface acoustic wave device using a Rayleigh wave, can be applied to various types of surface acoustic wave devices such as surface acoustic wave devices using an SH type wave and so forth.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
    a surface acoustic wave substrate;
    at least two independent, longitudinally-coupled surface acoustic wave filters disposed on the surface acoustic wave substrate;
    at least one inter-stage connecting portion electrically connecting said at least two independent, longitudinally-coupled surface acoustic wave filters to each other, such that the device has an at least two-stage configuration including said at least two independent, longitudinally-coupled surface acoustic wave filters; and
    a free surface portion located inside said at least one inter-stage connecting portion.

2. A surface acoustic wave device according to claim 1, wherein the free surface portion is a surface area inside of a perforation formed in the inter-stage connecting portion.

3. A surface acoustic wave device according to claim 2, wherein the perforation is a slit having an elongated shape.

4. A surface acoustic wave device according to claim 3, wherein the slit is arranged substantially parallel to the direction in which a surface acoustic wave is propagated on the at least two independent, longitudinally-coupled surface acoustic wave filters connected to the inter-stage connecting portion having the slit formed therein.

5. A surface acoustic wave device according to claim 3, wherein the slit is arranged so as to intersect the direction in which a surface acoustic wave is propagated on the at least two independent, longitudinally-coupled surface acoustic wave filters connected to the inter-stage connecting portion having the slit formed therein.

6. A surface acoustic wave device according to claim 5, wherein the slit is arranged substantially perpendicular to said propagation direction of the surface acoustic wave.

7. A surface acoustic wave device according to claim 3, wherein at least two slits are provided.

8. A surface acoustic wave device according to claim 1, wherein the inter-stage connecting portion is made of a metal that is heavier than Al.

9. A surface acoustic wave device according to claim 8, wherein the metal that is heavier than Al is at least one metal selected from the group consisting of Ta, W, Au, Pt, Ag, Mo, Cu, Ni, Co, Cr, Fe, Mn, and Ti, or an alloy including the metal as a major component.

10. A surface acoustic wave device according to claim 1, wherein the surface acoustic wave substrate is made of a piezoelectric single crystal substrate.

11. A surface acoustic wave device according to claim 1, wherein the at least two independent, longitudinally-coupled surface acoustic wave filters include one of surface acoustic wave resonators and surface acoustic wave filter elements.

12. A surface acoustic wave device comprising:
    a surface acoustic wave substrate;
    at least two independent, longitudinally-coupled surface acoustic wave filters disposed on the surface acoustic wave substrate;
    at least one inter-stage connecting portion electrically connecting said at least two independent, longitudinally-coupled surface acoustic wave filters to each other, such that the device has an at least two-stage configuration including said at least two independent, longitudinally-coupled surface acoustic wave filters; and
    at least one cut portion formed in the inter-stage connecting portion, the cut portion having at least one protuberance located on at least one side of the cut portion, the cut portion defining a free surface portion.

13. A surface acoustic wave device according to claim 12, wherein at least one cut portion is provided in the at least one inter-stage connecting portion.

14. A surface acoustic wave device according to claim 12, wherein the free surface portion is a surface area inside of a perforation formed in the at least one inter-stage connecting portion.

15. A surface acoustic wave device according to claim 14, wherein the perforation is a slit having an elongated shape.

16. A surface acoustic wave device according to claim 15, wherein the slit is arranged substantially parallel to the direction in which a surface acoustic wave is propagated on the at least two independent, longitudinally-coupled surface acoustic wave filters connected to the at least one inter-stage connecting portion having the slit formed therein.

17. A surface acoustic wave device according to claim 16, wherein the silt is arranged so as to intersect the direction in which a surface acoustic wave is propagated on the at least two independent, longitudinally-coupled surface acoustic wave filters connected to the at least one inter-stage connecting portion having the slit formed therein.

18. A surface acoustic wave device according to claim 17, wherein the slit is arranged substantially perpendicular to said propagation direction of the surface acoustic wave.

19. A surface acoustic wave device according to claim 15, wherein at least two slits are provided.

20. A surface acoustic wave device according to claim 12, wherein the at least one inter-stage connecting portion is made of a metal that is heavier than Al.

21. A surface acoustic wave device according to claim 20, wherein the metal that is heavier than Al is at least one metal selected from the group consisting of Ta, W, Au, Pt, Ag, Mo, Cu, Ni, Co, Cr, Fe, Mn, and Ti, or an alloy including the metal as a major component.

22. A surface acoustic wave device according to claim 12, wherein the surface acoustic wave substrate is made of a piezoelectric single crystal substrate.

23. A surface acoustic wave device according to claim 12, wherein the at least two independent longitudinally-coupled surface acoustic wave filters include one of surface acoustic wave resonators and surface acoustic wave filter elements.

* * * * *